US012300339B2

United States Patent
Tan et al.

(10) Patent No.: US 12,300,339 B2
(45) Date of Patent: May 13, 2025

(54) PERFORMING MEMORY TESTING USING ERROR CORRECTION CODE VALUES

(71) Applicant: Micron Technology, Inc., Boise, ID (US)

(72) Inventors: Kok Hua Tan, Singapore (SG); Chee Hock Ngo, Singapore (SG); Michael T. Brady, Loveland, CO (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 17/962,098

(22) Filed: Oct. 7, 2022

(65) Prior Publication Data

US 2023/0034275 A1 Feb. 2, 2023

Related U.S. Application Data

(63) Continuation of application No. 17/190,800, filed on Mar. 3, 2021, now Pat. No. 11,468,962.

(51) Int. Cl.
*G11C 29/42* (2006.01)
*G06F 11/10* (2006.01)

(52) U.S. Cl.
CPC .......... *G11C 29/42* (2013.01); *G06F 11/1004* (2013.01)

(58) Field of Classification Search
None
See application file for complete search history.

(56) References Cited

U.S. PATENT DOCUMENTS

| 3,585,378 A | 6/1971 | Bouricius et al. |
| 3,950,729 A * | 4/1976 | Fletcher ................. G11C 29/88 714/768 |
| 4,939,694 A | 7/1990 | Eaton et al. |
| 4,980,888 A | 12/1990 | Bruce et al. |

(Continued)

FOREIGN PATENT DOCUMENTS

KR 10-2019-0033410 A 3/2019

OTHER PUBLICATIONS

Wikipedia, "Cyclic redundancy check", "https://en.wikipedia.org/wiki/Cyclic_redundancy_check#:~:text=A%20cyclic%20redundancy%20check%20(CRC,polynomial%20division%20of%20their%20contents", Mar. 3, 2021, 11 pages.

(Continued)

*Primary Examiner* — Steve N Nguyen
(74) *Attorney, Agent, or Firm* — Brooks, Cameron & Huebsch, PLLC

(57) ABSTRACT

A system includes a memory component and a processing device operatively coupled with the memory component. The processing device performs a test of the memory component by generating an error correction code (ECC) value for an initial operation of the test based on an address in the memory component on which the initial operation of the test is performed, generating ECC values for subsequent operations of the test, and reporting the ECC value generated for the last of the subsequent operations of the test in an event log. The ECC value for each respective subsequent operation of the test is generated based on an address in the memory component on which that respective subsequent operation of the test is performed, and the ECC value generated for the operation of the test that was performed immediately before that respective subsequent operation.

16 Claims, 6 Drawing Sheets

(56) References Cited

U.S. PATENT DOCUMENTS

| | | | |
|---|---|---|---|
| 6,012,839 A | 1/2000 | Nguyen et al. | |
| 6,115,763 A * | 9/2000 | Douskey | G06F 11/267 |
| | | | 710/72 |
| 7,257,750 B1 | 8/2007 | Singh et al. | |
| 7,257,763 B1 | 8/2007 | Srinivasan et al. | |
| 8,645,811 B2 * | 2/2014 | Sauber | G06F 21/53 |
| | | | 714/48 |
| 9,286,181 B2 * | 3/2016 | Monroe | G06F 11/27 |
| 9,472,308 B1 | 10/2016 | Hwang | |
| 9,785,732 B2 * | 10/2017 | Pusuluri | G06F 30/392 |
| 10,133,664 B2 * | 11/2018 | Yang | G06F 11/1072 |
| 10,169,177 B1 * | 1/2019 | Shivaray | H03K 19/003 |
| 10,726,940 B2 * | 7/2020 | Li | G11C 16/10 |
| 10,777,295 B2 * | 9/2020 | Frolikov | G06F 3/0634 |
| 10,803,971 B2 | 10/2020 | Pyo et al. | |
| 10,825,541 B1 | 11/2020 | Fu et al. | |
| 2003/0217189 A1 * | 11/2003 | Kelley | G06F 11/3476 |
| | | | 719/314 |
| 2004/0103036 A1 * | 5/2004 | Nilsson | G06Q 20/201 |
| | | | 705/20 |
| 2005/0149824 A1 | 7/2005 | Arnez et al. | |
| 2005/0182997 A1 | 8/2005 | Kushida et al. | |
| 2006/0053361 A1 * | 3/2006 | Kim | G11C 29/42 |
| | | | 714/766 |
| 2008/0235485 A1 | 9/2008 | Haertel et al. | |
| 2009/0265403 A1 | 10/2009 | Fukumoto | |
| 2009/0316501 A1 * | 12/2009 | Bunker | G11C 29/70 |
| | | | 365/201 |
| 2010/0123005 A1 | 5/2010 | Guess et al. | |
| 2014/0245097 A1 | 8/2014 | Larsen et al. | |
| 2015/0363268 A1 * | 12/2015 | Chandra | G06F 11/0727 |
| | | | 714/801 |
| 2016/0133340 A1 | 5/2016 | Bowers et al. | |
| 2017/0147416 A1 | 5/2017 | Ranjan et al. | |
| 2017/0195164 A1 * | 7/2017 | Kacel | H04L 12/40 |
| 2017/0286197 A1 | 10/2017 | Halbert et al. | |
| 2017/0315909 A1 * | 11/2017 | Yang | G06F 11/1072 |
| 2019/0027230 A1 | 1/2019 | Ryu et al. | |

OTHER PUBLICATIONS

International Search Report and Written Opinion from related International Patent Application No. PCT/US2022/018113, dated Jun. 17, 2022, 10 pages.

* cited by examiner

PERFORMING MEMORY TESTING USING ERROR CORRECTION CODE VALUES

PRIORITY INFORMATION

This application is a Continuation of U.S. application Ser. No. 17/190,800 filed on Mar. 3, 2021, the contents of which are incorporated herein by reference.

TECHNICAL FIELD

Embodiments of the disclosure relate generally to memory sub-systems, and more specifically, relate to performing memory testing using error correction code values.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to performing memory testing using error correction code values. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory (e.g., storage device) can be tested for defects after it has been manufactured. For instance, a full array (e.g., full drive) test can be performed on the memory to check for defects in the memory. Such a test can include performing a sequence (e.g., loop) of test operations (e.g., test program, sense, and/or erase operations) on a sequence of addresses in the memory. The order of the sequence can depend on the portions of the memory (e.g., pages, blocks, planes, logical units, etc.) on which the operations are being performed during the test, and/or on which operations (e.g., program, sense, or erase) are being performed during the test.

In some instances, however, defects in the firmware of the memory (e.g., manufacturing test firmware defects and/or customer firmware defects) and/or defects in the controller of the memory (e.g., compute engine defects and/or state machine defects) can cause an unintentional modification to the test sequence, such that the operations of the test are not performed on the correct addresses in the memory in the correct sequence. Such a modification can adversely affect the integrity (e.g., the quality and/or accuracy) of the test.

Aspects of the present disclosure address this and other deficiencies by using error correction code values to validate (e.g., verify) that the operations of a memory test have been performed on the correct addresses in the memory in the correct sequence. For instance, aspects of the present disclosure can compare an expected error correction code value for an operation of the test to the actual error correction code value for that operation of the test to determine whether the address on which the operation was performed is the address in the sequence on which that operation was expected to be performed. Accordingly, aspects of the present disclosure can be used to validate the integrity (e.g., the quality and/or accuracy) of the test.

Further, using the error correction code values to validate the memory test in accordance with the present disclosure can have a minimal impact on (e.g., can cause only a minimal increase in) the test time (e.g., the amount of time needed to perform the test). For instance, using the error correction code values to validate the memory test in accordance with the present disclosure can increase the test time by less than 1% (e.g., by 0.55-0.88%).

Figure 1:
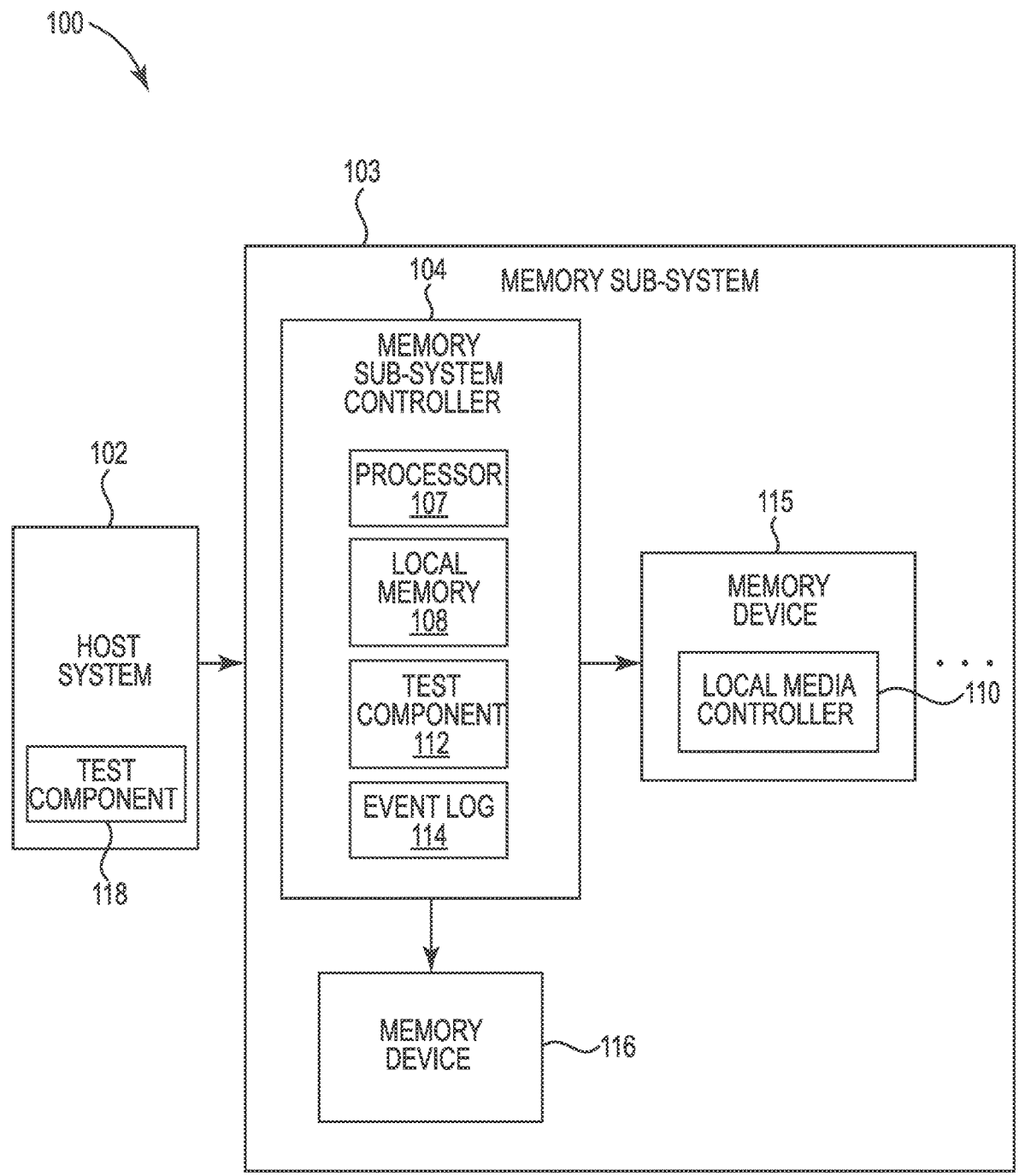
FIG. 1 illustrates an example computing environment that includes a memory sub-system in accordance with some embodiments of the present disclosure.

FIG. 1 illustrates an example computing environment 100 that includes a memory sub-system 103 in accordance with some embodiments of the present disclosure. The memory sub-system 103 can include media, such as one or more volatile memory devices (e.g., memory device 116), one or more non-volatile memory devices (e.g., memory device 115), or a combination of such.

A memory sub-system 103 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a cross-point storage device, and a hard disk drive (HDD). Examples of memory modules include a dual in-line memory module (DIMM), a small outline DIMM (SO-DIMM), and various types of non-volatile dual in-line memory module (NVDIMM).

The computing environment 100 can include a host system 102 that is coupled to one or more memory sub-systems 103. In some embodiments, the host system 102 is coupled to different types of memory sub-system 103. FIG. 1 illustrates one example of a host system 102 coupled to one memory sub-system 103. The host system 102 uses the memory sub-system 103, for example, to write data to the memory sub-system 103 and read data from the memory sub-system 103. As used herein, "coupled to" generally refers to a connection between components, which can be an indirect communicative connection or direct communicative connection (e.g., without intervening components), whether wired or wireless, including connections such as electrical, optical, magnetic, etc.

The host system 102 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes a memory and a processing device. The host system 102 can be coupled to the memory sub-system 103 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 102 and the memory sub-system 103. The host system 102 can further utilize an NVM Express (NVMe) interface to access the memory components (e.g., memory devices 115) when the memory sub-system 103 is coupled with the host system 102 by the PCIe interface. The physical host interface can provide an interface for passing control, address, data, and other signals between the memory sub-system 103 and the host system 102.

The memory devices can include any combination of the different types of non-volatile memory devices and/or volatile memory devices. The volatile memory devices (e.g., memory device 116) can be, but are not limited to, random access memory (RAM), such as dynamic random access memory (DRAM) and synchronous dynamic random access memory (SDRAM).

An example of non-volatile memory devices (e.g., memory device 115) includes a negative-and (NAND) type flash memory. Each of the memory devices 115 can include one or more arrays of memory cells. The memory cells can include single level cells (SLCs) that can store one bit per cell, multi-level cells (MLCs) that can store two bits per cell, triple level cells (TLCs) that can store three bits per cell, quad-level cells (QLCs) that can store four bits per cell, and/or penta-level cells (PLCs) that can store five bits per cell, among others. As used herein, the term multiple level cells is used to refer to cells configured to store more than one bit per cell (e.g., MLC, TLC, QLC, PLC, etc.). In some embodiments, a particular memory component can include an SLC portion, and an MLC portion, a TLC portion, a QLC portion, and/or a PLC portion of memory cells. Each of the memory cells can store one or more bits of data used by the host system 102. Furthermore, the memory cells of the memory devices 115 can be grouped as memory pages or memory blocks that can refer to a unit of the memory component used to store data. An example of such a grouping will be further described herein (e.g., in connection with FIG. 5).

Although non-volatile memory components such as NAND type flash memory are described, the memory device 115 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 104 can communicate with the memory devices 115 to perform operations such as reading data, writing data, or erasing data at the memory devices 115 and other such operations. The memory sub-system controller 104 can include hardware such as one or more integrated circuits and/or discrete components, a buffer memory, or a combination thereof. The memory sub-system controller 104 can be a microcontroller, special purpose logic circuitry (e.g., a field programmable gate array (FPGA), an application specific integrated circuit (ASIC), etc.), or other suitable processor.

The memory sub-system controller 104 can be a processing device, which includes one or more processors (e.g., processor 107) configured to execute instructions stored in a local memory 108. In the illustrated example, the local memory 108 of the memory sub-system controller 104 includes an embedded memory configured to store instructions for performing various processes, operations, logic flows, and routines that control operation of the memory sub-system 103, including handling communications between the memory sub-system 103 and the host system 102.

In some embodiments, the local memory 108 can include memory registers storing memory pointers, fetched data, etc. The local memory 108 can also include read-only memory (ROM) for storing micro-code. While the example memory sub-system 103 in FIG. 1 has been illustrated as including the memory sub-system controller 104, in another embodiment of the present disclosure, a memory sub-system 103 does not include a memory sub-system controller 104, and can instead rely upon external control (e.g., provided by an external host, or by a processor or controller separate from the memory sub-system).

In general, the memory sub-system controller 104 can receive commands or operations from the host system 102 and can convert the commands or operations into instructions or appropriate commands to achieve the desired access to the memory devices 115. The memory sub-system controller 104 can be responsible for other operations such as wear leveling operations, garbage collection operations, error detection and error-correcting code (ECC) operations, encryption operations, caching operations, and address translations between a logical block address and a physical block address that are associated with the memory devices 115. The memory sub-system controller 104 can further include host interface circuitry to communicate with the host system 102 via the physical host interface. The host interface circuitry can convert the commands received from the host system into command instructions to access the memory devices 115 as well as convert responses associated with the memory devices 115 into information for the host system 102.

The memory sub-system 103 can also include additional circuitry or components that are not illustrated. In some embodiments, the memory sub-system 103 can include a cache or buffer (e.g., DRAM) and address circuitry (e.g., a row decoder and a column decoder) that can receive an address from the memory sub-system controller 104 and decode the address to access the memory devices 115.

In some embodiments, the memory devices 115 include local media controllers 110 that operate in conjunction with memory sub-system controller 104 to execute operations on one or more memory cells of the memory devices 115.

The memory sub-system 103 and host system 102 can each include a test component 112 and 118, respectively, that can be used to perform testing of memory device 115 using error correction code values. In some embodiments, the memory sub-system controller 104 includes at least a portion of the test component 112. For example, the memory sub-system controller 104 can include a processor 107 (processing device) configured to execute instructions stored in local memory 108 for performing the operations described herein. In some embodiments, the memory device 115 includes at least a portion of the test component 112. In some embodiments, the test component 118 is part of the host system 102, an application, or an operating system.

For example, test component 112 can perform a test (e.g., a test loop) of memory device 115, and test component 118 can then simulate the test (e.g., re-run the test loop) of memory device 115. The test can be a full test of memory device 115 (e.g., full array and/or full drive test) that includes a test of all blocks of memory cells of memory device 115. Test component 118 can simulate the test after the test has been performed by test component 112, such that the test loop followed by test component 118 (e.g., by host system 102) is the same test loop followed by test component 112 (e.g., by memory sub-system 103). In some embodiments, test component 112 can perform the test using firmware of memory sub-system 103 (e.g., of controller 104), and test component 118 can simulate the test using an external script, such as Python, for instance.

For example, test component 112 can generate an error correction code (ECC) value for the initial (e.g., first) operation of the test based on the address (e.g., the logical address) in memory device 115 on which the initial operation of the test is performed. Test component 112 can then generate ECC values for the subsequent operations of the test. The ECC value for each respective subsequent operation of the test can be generated based on the address (e.g., the logical address) in memory device 115 on which that respective operation of the test is performed, and on the ECC value that was generated for the operation of the test that was performed immediately before that respective operation. For instance, the ECC value for the second operation of the test can be generated based on the address on which the second operation is performed and on the ECC value that was generated for the first operation of the test, the ECC value for the third operation of the test can be generated based on the address on which the third operation is performed and on the ECC value generated for the second operation of the test, etc.

As an example, test component 112 can issue each respective operation of the test by submitting a request to perform that operation through a command descriptor. Each time such a command descriptor is submitted, test component 112 can also generate (e.g., compute) an ECC value based on the address of that operation and the ECC value for the previous operation.

The operations (e.g., the initial operation and subsequent operations) of the test can include, for example, erase operations, program (e.g., write) operations, and/or sense (e.g., read) operations. In some embodiments, the operations can include, and ECC values can be generated for, only sense operations (e.g., no program or erase operations). Including only sense operations can reduce the test time (e.g., because a successful sense operation can imply a successful program or erase operation).

The ECC values generated for the operations (e.g., the initial operation and subsequent operations) of the test can be, for example, cyclic redundancy check (CRC) code values. For instance, the ECC values can be CRC values generated using a CRC table and CRC function, as will be further described herein (e.g., in connection with FIG. 4). However, embodiments are not limited to a particular type of ECC value. For instance, in some embodiments, the ECC values can be checksum code values.

In some embodiments, the ECC values for the operations (e.g., for the initial operation and subsequent operations) can be generated for only the first page and the last page of each respective block of memory cells of memory device 115 on which the operations of the test are performed (e.g., instead of generating ECC values for the full block). Generating ECC values for only the first and last pages of the blocks can reduce the test time.

Once the test is finished (e.g., after the last operation of the test has been performed), test component 112 can report (e.g., store) the ECC value generated for the last operation (e.g., the last of the subsequent operations) of the test in event log 114. In the example illustrated in FIG. 1, event log 114 is included in memory sub-system controller 104. However, in some embodiments, event log 114 can be included in memory device 115. Further, in some embodiments, event log 114 can be included in host system 102 (e.g., instead of in controller 104).

In some examples, a block of memory cells of memory device 115 on which an operation of the test is to be performed may not actually have the operation performed thereon during the test (e.g., the block may be skipped during the test), and accordingly no ECC value would be generated for the block during the test. Test component 112 can report any such skipped blocks in event log 114.

The skipped blocks reported in event log 114 can include, for example, blocks of memory cells of memory device 115 that have been designated (e.g., marked during manufacturing) as bad blocks, and/or blocks of memory cells of memory device used to store system data (e.g., blocks designated as bad blocks and blocks used to store system data can be skipped during the test). As used herein, a "bad block" can include and/or refer to an area of storage media that is not reliable for storing and/or retrieving data (e.g. user data) because it is physically damaged or corrupted. System data, as used herein, can include and/or refer to data associated with, and/or programmed to, a memory sub-system during, manufacture of the memory sub-system.

After test component 112 has performed the test (e.g., after the last operation of the test has been performed by test component 112 and the ECC value generated for that last operation of the test has been reported in event log 114), the same test (e.g. the same test loop) can be simulated by test component 118. For example, test component 118 can generate an ECC value for the initial (e.g., first) operation of the test based on the address (e.g., the logical address) in memory device 115 on which the initial operation of the test is performed. Test component 118 can then generate ECC values for the subsequent operations of the test. The ECC value for each respective subsequent operation of the test can be generated based on the address (e.g., the logical address) in memory device 115 on which that respective operation of the test is performed, and on the ECC value that was generated for the operation of the test that was performed immediately before that respective operation, in a manner analogous to that previously described herein for test component 112.

The operations (e.g., the initial operation and subsequent operations) of the test can be the same sequence of operations performed by test component 112. The ECC values generated for the operations of the test can be, for example, CRC code values generated using a CRC table and CRC function, or checksum values, in a manner analogous to that previous described for test component 112. In some embodiments, the ECC values for the operations can be generated for only the first page and the last page of each respective block of memory cells of memory device 115 on which the operations of the test are performed, in a manner analogous to that previously described for test component 112.

Once test component 118 has finished simulating the test (e.g., after the last operation of the test has been simulated by test component 118), test component 118 can compare the ECC value it generated for the last operation (e.g., the last of the subsequent operations) of the test to the ECC value in event log 114 (e.g., to the ECC value generated for the last operation of the test by test component 112). If the comparison indicates these two ECC values (e.g., the ECC value for the last operation of the test generated by test component 112 and the ECC value for the last operation of the test generated by test component 118) are the same (e.g. aligned), test component 118 can validate the test (e.g., validate that the operations of the test performed by test component 112 were performed on the correct address in memory device 115 in the correct sequence). If, however, the comparison indicates these two ECC values are different (e.g., not aligned), test component 118 can invalidate the test. For instance, these two ECC values being different can be an indication that the operations of the test performed by test component 112 were not performed on the correct addresses in memory device 115, and/or were not performed in the correct sequence.

In examples in which a block(s) of memory cells of memory device 115 was skipped during the test performed by test component 112 (e.g., due to being designated as a bad block or being used to store system data, as previously described herein), and reported as skipped in event log 114, that block(s) can also be skipped during the test by test component 118. For example, for any blocks reported as skipped in event log 114, test component 118 would not perform an operation of the test on those blocks, and accordingly would not generate an ECC value for those blocks.

Figure 2:
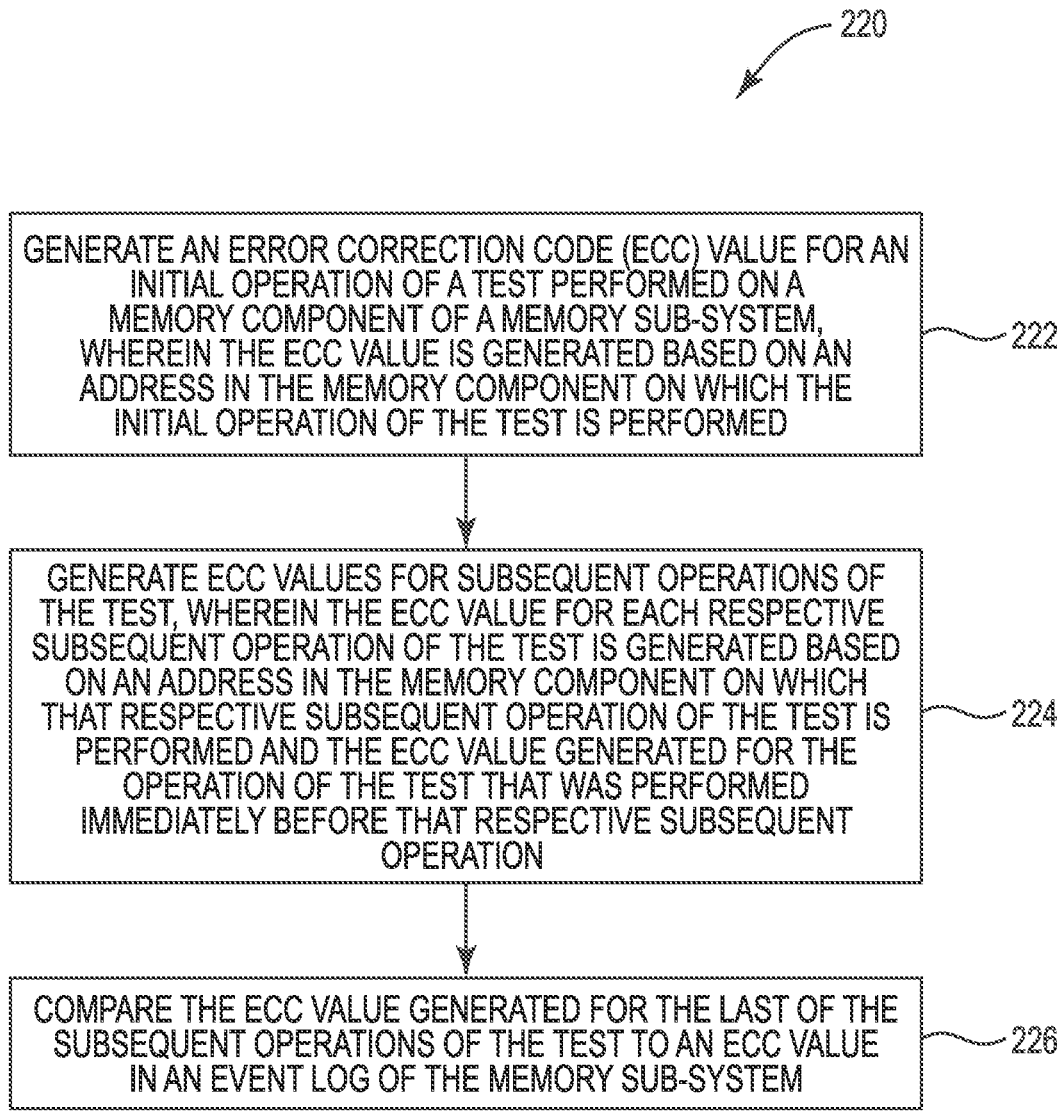
FIG. 2 is a flow diagram of an example method to perform memory testing using error correction code values in accordance with some embodiments of the present disclosure.

FIG. 2 is a flow diagram of an example method 220 to perform memory testing using error correction code values in accordance with some embodiments of the present disclosure. The method 220 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 220 is performed by test component 118 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 222, the processing logic generates an error correction code (ECC) value for an initial (e.g., the first) operation of a test (e.g., test loop) performed on a memory component of a memory sub-system. The ECC value is generated based on an address (e.g., logical address) in the memory component on which the initial operation of the test is performed.

The memory component and memory sub-system can be, for example, memory device 115 and memory sub-system 103, respectively, previously described in connection with FIG. 1. The test can be a full test of the memory component that includes a sequence of test operations, as previously described herein. The initial operation of the test can be, for example, an erase, program or sense operation, as previously described herein. The ECC value can be, for example, a CRC code value generated using a CRC table and CRC function, or a checksum value, as previously described herein and will be further described in connection with FIG. 4.

At operation 224, the processing logic generates ECC values for subsequent operations of the test. The ECC value for each respective subsequent operation of the test is generated based on an address (e.g., logical address) in the memory component on which that respective subsequent operation of the test is performed and the ECC value generated for the operation of the test that was performed immediately before that respective subsequent operation.

The subsequent operations of the test can be, for example, erase, program and/or sense operations, or only sense operations, as previously described herein. The ECC values can be, for example, CRC code values generated using a CRC table and CRC function, or checksum values, as previously described herein and will be further described herein in connection with FIG. 4.

At operation 226, the processing logic compares the ECC value generated for the last of the subsequent operations of the test to an ECC value in an event log of the memory sub-system. The event log can be, for example, event log 114 previously described in connection with FIG. 1, and the ECC value in the event log can be an ECC value generated by the memory sub-system for the last of the subsequent operations of the test, as previously described herein. The result of the comparison (e.g., whether the compared ECC values are the same or different) can be used to validate or invalidate the test, as previously described herein.

Figure 3:
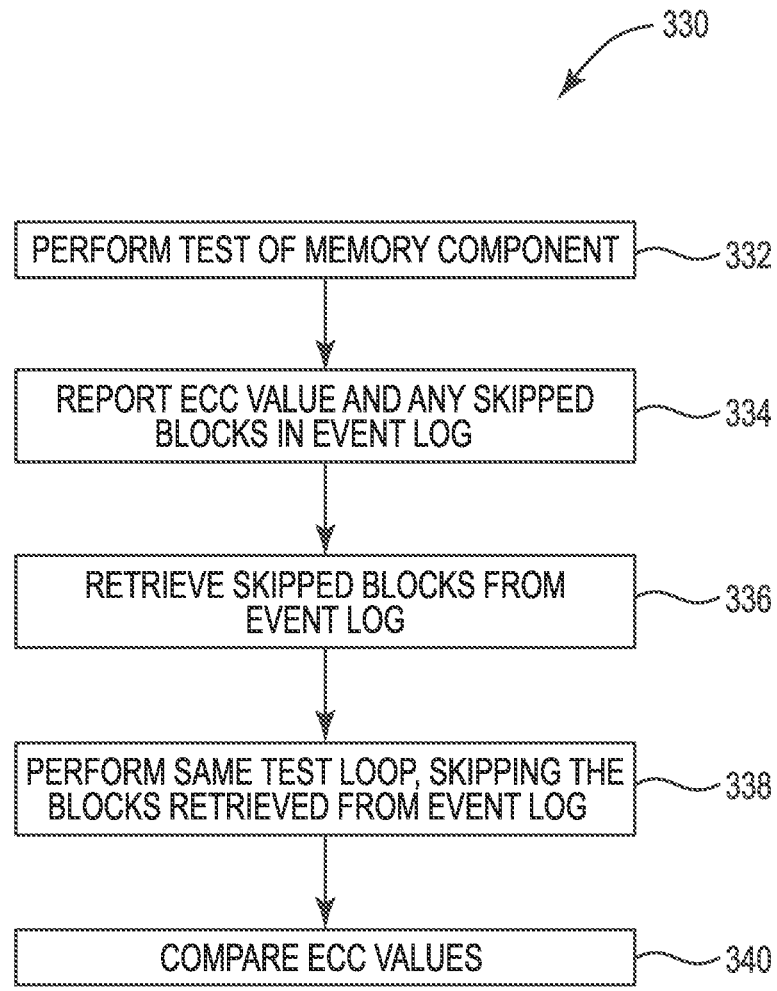
FIG. 3 is a flow diagram of an example method to perform memory testing using error correction code values in accordance with some embodiments of the present disclosure.

FIG. 3 is a flow diagram of an example method 330 to perform memory testing using error correction code values in accordance with some embodiments of the present disclosure. The method 330 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 330 is performed by test components 112 and 118 of FIG. 1. For example, operations 332 and 334 can be performed by test component 112 using firmware, and operations 336, 338, and 340 can be performed by test component 118 using an external script. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 332, a test of a memory component is performed. The memory component can be, for example, memory device 115 of memory sub-system 103 previously described in connection with FIG. 1. As previously described herein, the test can be a full test of the memory component that includes a sequence of test operations. As previously described herein, the test can be performed by generating an ECC value for the initial (e.g., first) operation of the test based on the address in the memory component on which the initial operation of the test is performed, and then generating ECC values for the subsequent operations of the test based on the address in the memory component on which that respective operation of the test is performed and on the ECC value that was generated for the operation of the test that was performed immediately before that respective operation.

The operations of the test can be, for example, erase, program and/or sense operations, or only sense operations, as previously described herein. The ECC values can be, for example, CRC code values generated using a CRC table and CRC function, or checksum values, as previously described herein and will be further described herein in connection with FIG. 4. In some embodiments, the ECC values can be generated for only the first page and the last page of each respective block of memory cells of the memory component on which the operations of the test are performed, as previously described herein.

In some examples, a block of memory cells of the memory component on which an operation of the test is to be performed may not actually have the operation performed thereon during the test (e.g., the block may be skipped during the test), and accordingly no ECC value would be generated for the block during the test, as previously described herein. The block may be skipped due to, for example, being designated as a bad block or being used to store system data, as previously described herein At operation 334, the ECC value generated for the last of the subsequent operations, and any blocks that were skipped during the test, are reported in an event log. The event log can be, for example, event log 114 previously described in connection with FIG. 1.

At operation 336, the blocks that were skipped during the test are retrieved from the event log. At operation 338, the same sequence (e.g., loop) of test operations that was performed at operation 332 are performed, skipping the blocks retrieved from the event log. For example, an ECC value is generated for the initial operation of the test based on the address in the memory component on which the initial operation of the test is performed, and then ECC values are generated for the subsequent operations of the test based on the address in the memory component on which that respective operation of the test is performed and on the ECC value that was generated for the operation of the test that was performed immediately before that respective operation, in the same sequence as at operation 332. However, an operation of test is not performed on, and no ECC value is generated for, any blocks retrieved from the event log.

At operation 340, the last ECC value generated at operation 338 (e.g., the ECC value generated for the last of the subsequent operations of the test performed at operation 338) is compared to the ECC value that was reported in the event log at operation 334. If the comparison indicates these two ECC values are the same (e.g. aligned), the test of the memory component can be validated, as previously described herein. If, however, the comparison indicates these two ECC values are different (e.g., not aligned), the test of the memory component can be invalidated, as previously described herein.

Figure 4:
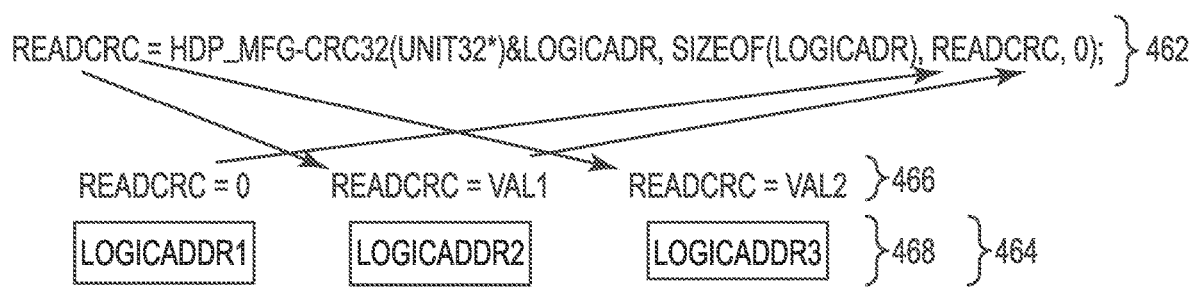
FIG. 4 illustrates an example cyclic redundancy check (CRC) table and CRC function used to generate error correction code (ECC) values for the operations of a memory test in accordance with some embodiments of the present disclosure.

FIG. 4 illustrates an example CRC table 464 and CRC function 462 used to generate ECC values (e.g., CRC values 466) for the operations of a memory test in accordance with some embodiments of the present disclosure. The test can be, for example, a test (e.g., test loop) performed on memory device 115 of memory sub-system 103 by test component 112 and 118, as previously described in connection with FIG. 1. In the example illustrated in FIG. 4, the operations of the test can include only sense (e.g., read) operations.

As shown in FIG. 4, CRC table 464 includes the addresses (e.g., logical addresses) 468 in the memory on which the operations of the test are performed. For simplicity, only the addresses on which the first three operations of the test are performed (e.g., LOGICADDR1, LOGICADDR2, and LOGICADDR3) are illustrated in FIG. 4.

CRC function 462 can generate the CRC value 466 for the initial operation of the test (e.g., READCRC=0) using the logical address included in table 464 on which the initial operation of the test is performed (e.g., LOGICADDR1). CRC function 462 can then generate the CRC values 466 for each respective subsequent operation of the test using the logical address included in table 464 on which that respective subsequent operation is performed, and the CRC value generated for the operation of the test that was performed immediately before that respective subsequent operation.

For example, as shown in FIG. 4, CRC function 462 can generate the CRC value 466 for the second operation of the test (e.g., READCRC=VAL1) using the logical address included in table 464 on which the second operation of the test is performed (e.g., LOGICADDR2), and the CRC value 466 that was generated for the initial operation of the test (e.g., READCRC=0). The CRC value 466 generated for the initial operation of the test (e.g., READCRC=0) can then be discarded. CRC function 462 can then generate the CRC value 466 for the third operation of the test (e.g., READCRC=VAL2) using the logical address included in table 464 on which the third operation of the test is performed (e.g., LOGICADDR3), and the CRC value 466 that was generated for the second operation of the test (e.g., READCRC=VAL1), as illustrated in FIG. 4. The CRC value 466 generated for the second operation of the test (e.g., READCRC=VAL1) can then be discarded. CRC function 462 can continue to generate the CRC values for the remaining operations of the test in an analogous manner.

Figure 5:
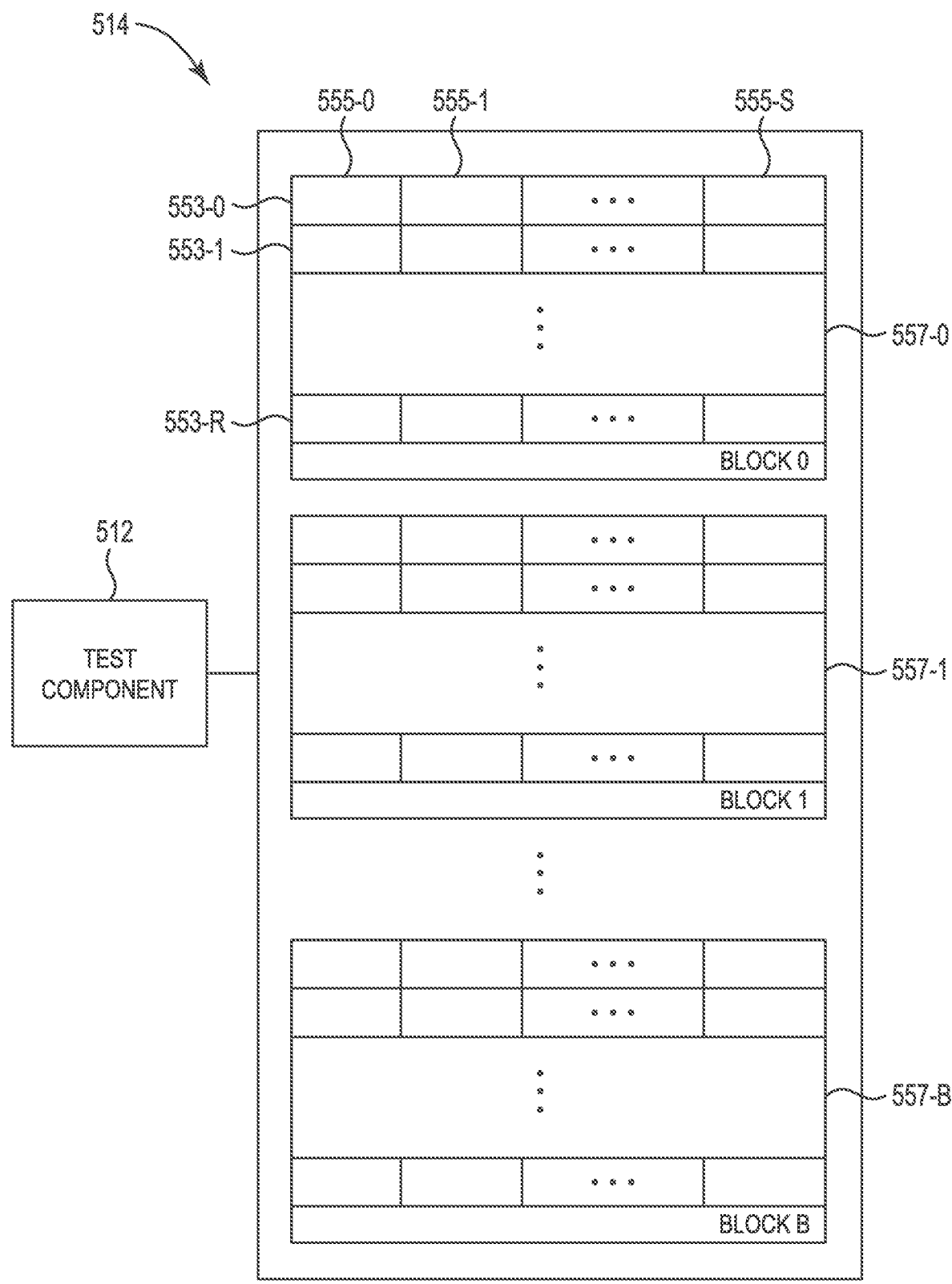
FIG. 5 illustrates a diagram of a portion of a memory array having a number of physical blocks in accordance with some embodiments of the present disclosure.

FIG. 5 illustrates a diagram of a portion of a memory array 514 having a number of physical blocks and coupled to a test component 512 in accordance with some embodiments of the present disclosure. The test component 512 can be analogous to test component 112 described in connection with FIG. 1. As described herein, the test component 512, in some embodiments, can perform actions to perform testing of memory array 514 using error correction code values.

Memory array 514 can be, for example, a NAND flash memory array. As an additional example, memory array 514 can be a storage class memory (SCM) array, such as, for instance, a three-dimensional cross-point memory array, a ferroelectric RAM (FRAM) array, or a resistance variable memory array such as a PCRAM, RRAM, or spin torque transfer (STT) array, among others. Further, although not shown in FIG. 5, memory array 514 can be located on a particular semiconductor die along with various peripheral circuitry associated with the operation thereof.

As shown in FIG. 5, memory array 514 has a number of physical blocks 557-0 (BLOCK 0), 557-1 (BLOCK 1), . . . , 557-B (BLOCK B) of memory cells. The memory cells can be operated and/or programmed according to a particular programming characteristic (e.g., programming mode) as single level cells and/or multilevel cells such as, for instance, two level cells, triple level cells (TLCs) or quadruple level cells (QLCs), and/or penta-level cells (PLC). As an example, the number of physical blocks in memory array 514 can be 128 blocks, 512 blocks, or 1,024 blocks, but embodiments are not limited to a particular power of two or to any particular number of physical blocks in memory array 514.

A number of physical blocks of memory cells (e.g., blocks 557-0, 557-1, . . . , 557-B) can be included in a plane of memory cells, and a number of planes of memory cells can be included on a die. For instance, in the example shown in FIG. 5, each physical block 557-0, 557-1, . . . , 557-B can be part of a single die. That is, the portion of memory array 514 illustrated in FIG. 5 can be a die of memory cells.

As shown in FIG. 5, each physical block 557-0, 557-1, . . . , 557-B includes a number of physical rows (e.g., 553-0, 553-1, . . . , 553-R) of memory cells coupled to access lines (e.g., word lines). The number of rows (e.g., word lines) in each physical block can be 32, but embodiments are not limited to a particular number of rows 553-0, 553-1, . . . , 553-R per physical block. Further, although not shown in FIG. 5, the memory cells can be coupled to sense lines (e.g., data lines and/or digit lines).

As one of ordinary skill in the art will appreciate, each row 553-0, 553-1, . . . , 553-R can include a number of pages of memory cells (e.g., physical pages). A physical page refers to a unit of programming and/or sensing (e.g., a number of memory cells that are programmed and/or sensed together as a functional group). In the embodiment shown in FIG. 5, each row 553-0, 553-1, . . . , 553-R comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

As shown in FIG. 5, a page of memory cells can comprise a number of physical sectors 555-0, 555-1, . . . , 555-S (e.g., subsets of memory cells). Each physical sector 555-0, 555-1, . . . , 555-S of cells can store a number of logical sectors of data. Additionally, each logical sector of data can correspond to a portion of a particular page of data. As an example, one logical sector of data stored in a particular physical sector can correspond to a logical sector corresponding to one page of data, and the other logical sector of data stored in the particular physical sector can correspond to the other page of data. Each physical sector 555-0, 555-1, . . . , 555-S, can store system and/or user data, and/or can include overhead data, such as error correction code (ECC) data, logical block address (LBA) data, and metadata.

Logical block addressing is a scheme that can be used by a host for identifying a logical sector of data. For example, each logical sector can correspond to a unique logical block address (LBA). Additionally, an LBA can also correspond (e.g., dynamically map) to a physical address, such as a physical block address (PBA), that can indicate the physical location of that logical sector of data in the memory. A logical sector of data can be a number of bytes of data (e.g., 256 bytes, 512 bytes, 1,024 bytes, or 4,096 bytes). However, embodiments are not limited to these examples.

It is noted that other configurations for the physical blocks 557-0, 557-1, . . . , 557-B, rows 553-0, 553-1, . . . , 553-R, sectors 555-0, 555-1, . . . , 555-S, and pages are possible. For example, rows 553-0, 553-1, . . . , 553-R of physical blocks 557-0, 557-1, . . . , 557-B can each store data corresponding to a single logical sector which can include, for example, more or less than 512 bytes of data. Further, memory array 514 can be partitioned using addresses to delineate pages, blocks, etc.

Figure 6:
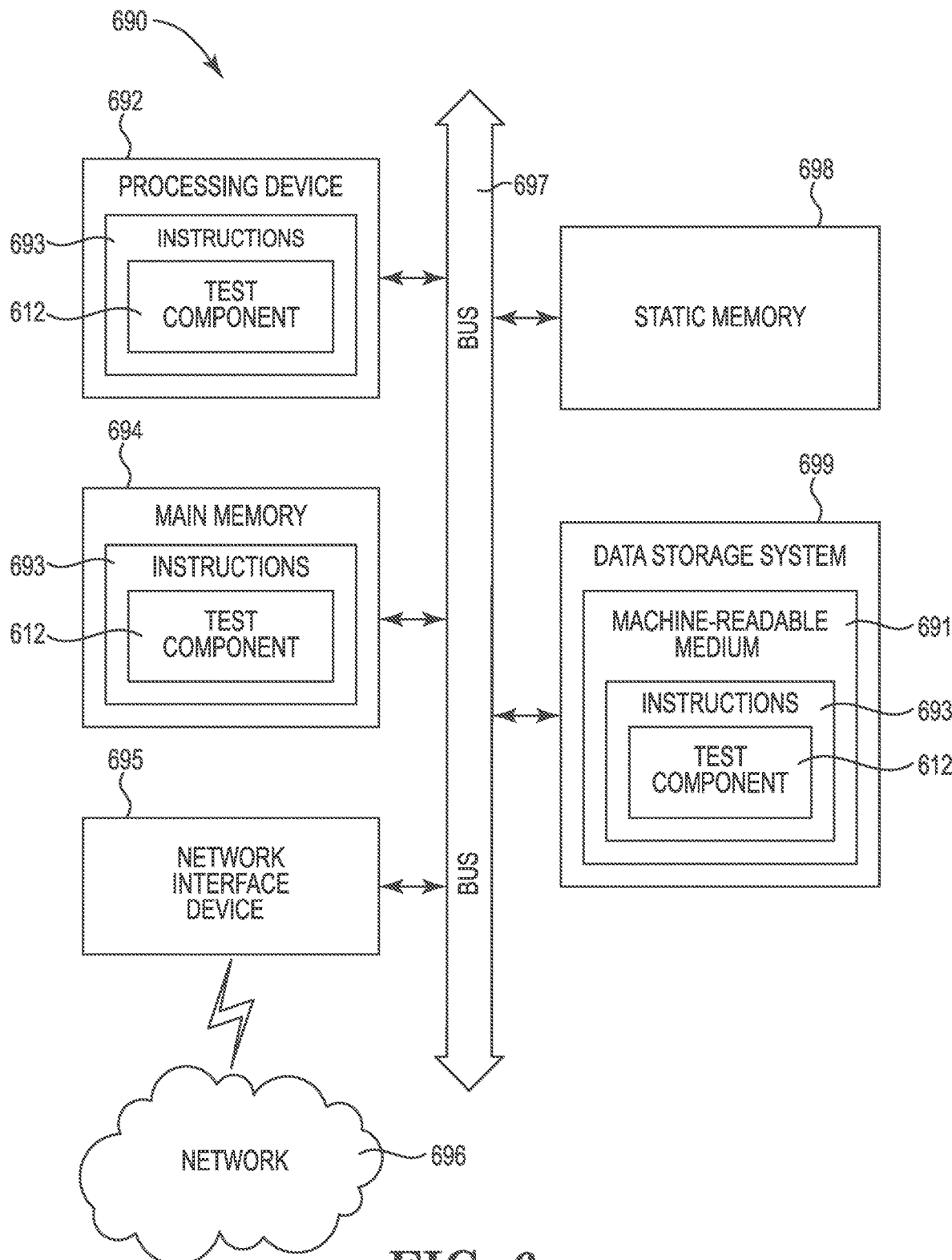
FIG. 6 is a block diagram of an example computer system in which embodiments of the present disclosure can operate.

FIG. 6 illustrates an example machine of a computer system 690 within which a set of instructions, for causing the machine to perform any one or more of the methodologies discussed herein, can be executed. In some embodiments, the computer system 690 can correspond to a host system (e.g., the host system 102 of FIG. 1) that includes, is coupled to, or utilizes a memory sub-system (e.g., the memory sub-system 103 of FIG. 1) or can be used to perform the operations of a controller (e.g., to execute an operating system to perform operations corresponding to test components 112 and/or 118 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 690 includes a processing device 692, a main memory 694 (e.g., read-only memory (ROM), flash memory, dynamic random access memory (DRAM) such as synchronous DRAM (SDRAM) or RDRAM, etc.), a static memory 698 (e.g., flash memory, static random access memory (SRAM), etc.), and a data storage system 699, which communicate with each other via a bus 697.

Processing device 692 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 692 can also be one or more special-purpose processing devices such as an application specific integrated circuit (ASIC), a field programmable gate array (FPGA), a digital signal processor (DSP), network processor, or the like. The processing device 692 is configured to execute instructions 693 for performing the operations and steps discussed herein. The computer system 690 can further include a network interface device 695 to communicate over the network 696.

The data storage system 699 can include a machine-readable storage medium 691 (also known as a computer-readable medium) on which is stored one or more sets of instructions 693 or software embodying any one or more of the methodologies or functions described herein. The instructions 693 can also reside, completely or at least partially, within the main memory 694 and/or within the processing device 692 during execution thereof by the computer system 690, the main memory 694 and the processing device 692 also constituting machine-readable storage media. The machine-readable storage medium 691, data storage system 699, and/or main memory 694 can correspond to the memory sub-system 103 of FIG. 1.

In one embodiment, the instructions 693 include instructions to implement functionality corresponding to test component 612 (e.g., test component 112 of FIG. 1). While the machine-readable storage medium 691 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

As used herein, the designators "N", "R", "S", and "B", particularly with respect to reference numerals in the drawings, indicates that a number of the particular feature so designated can be included with a number of embodiments of the present disclosure. Additionally, as used herein, "a", "an", or "a number of" can refer to one or more of something, and "a plurality of" can refer to more than one of such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures can be identified by the use of similar digits. For example, 112 can reference element "12" in FIG. 1, and a similar element can be referenced as 612 in FIG. 6.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 a memory component; and
 a processing device, operatively coupled with the memory component, to perform a test of blocks of memory cells of the memory component by:
  generating an error correction code (ECC) value for an initial operation of the test based on an address in the memory component on which the initial operation of the test is performed;
  generating ECC values for subsequent operations of the test, wherein the ECC value for each respective subsequent operation of the test is generated based on:
   an address in the memory component on which that respective subsequent operation of the test is performed; and
   the ECC value generated for the operation of the test that was performed immediately before that respective subsequent operation; and reporting the ECC value generated for the last of the subsequent operations of the test in an event log; and
wherein the processing device is further to:
skip a block of the blocks of memory cells of the memory component while performing the test of the memory component, wherein the skipped block is a block of memory cells of the memory component used to store system data, wherein the system data includes data associated with manufacture of the memory component; and
report the skipped block of the blocks of memory cells in the event log after the block was skipped during the test;
wherein only the ECC value generated for the last of the subsequent operations of the test and the skipped block of the block of memory cells are reported in the event log.

2. The apparatus of claim 1, wherein the ECC values for the initial operation and subsequent operations of the test are generated using a cyclic redundancy check (CRC) table.

3. The apparatus of claim 2, wherein the CRC table includes the addresses in the memory component on which the initial operation and subsequent operations of the test are performed.

4. The apparatus of claim 1, wherein the ECC values for the initial operation and subsequent operations of the test are generated using a cyclic redundancy check (CRC) function.

5. The apparatus of claim 1, wherein the addresses in the memory component on which the initial operation and subsequent operations of the test are performed are logical addresses.

6. A method, comprising:
generating an error correction code (ECC) value for an initial operation of a test performed on blocks of memory cells of a memory component of a memory sub-system, wherein the ECC value is generated based on an address in the memory component on which the initial operation of the test is performed;
generating ECC values for subsequent operations of the test, wherein the ECC value for each respective subsequent operation of the test is generated based on:
an address in the memory component on which that respective subsequent operation of the test is performed; and
the ECC value generated for the operation of the test that was performed immediately before that respective subsequent operation;
comparing only the ECC value generated for the last of the subsequent operations of the test to an ECC value in an event log of the memory sub-system;
skipping a block of the blocks of memory cells of the memory component while performing the test on the memory component, wherein the skipped block is a block of memory cells of the memory component used to store system data, wherein the system data includes data programmed to the memory component during manufacture of the memory sub-system; and
reporting only the skipped block of the blocks of memory cells in the event log after the block was skipped during the test.

7. The method of claim 6, wherein the method includes validating the test based on a result of the comparison.

8. The method of claim 6, wherein the method includes invalidating the test based on a result of the comparison.

9. The method of claim 6, wherein the method includes simulating, by a host system, the test after the test is performed on the blocks of memory cells of the memory component of the memory sub-system.

10. An apparatus, comprising:
an event log;
a memory component; and
a processing device, operatively coupled with the memory component, to:
perform a test of blocks of memory cells of the memory component by:
generating an error correction code (ECC) value for an initial operation of the test based on an address in the memory component on which the initial operation of the test is performed;
generating ECC values for subsequent operations of the test, wherein the ECC value for each respective subsequent operation of the test is generated based on:
an address in the memory component on which that respective subsequent operation of the test is performed; and
the ECC value generated for the operation of the test that was performed immediately before that respective subsequent operation;
validate the test using an ECC value in the event log and only the ECC value generated for the last of the subsequent operations of the test;
skip a block of the blocks of memory cells of the memory component while performing the test of the memory component, wherein the skipped block is a block of memory cells of the memory component used to store system data, wherein the system data includes data associated with, and programmed to the memory component during, manufacture of the memory component; and
report only the skipped block of the blocks of memory cells in the event log after the block was skipped during the test.

11. The apparatus of claim 10, wherein validating the test using only the ECC value generated for the last of the subsequent operations of the test comprises validating the test without using the ECC value generated for the initial operation of the test and any of the ECC values generated for the subsequent operations of the test prior to the last of the subsequent operations of the test.

12. The apparatus of claim 10, wherein the processing device is to validate the test responsive to the ECC value in the event log and the ECC value generated for the last of the subsequent operations of the test being a same value.

13. The apparatus of claim 10, wherein the processing device is to invalidate the test using the ECC value in the event log and only the ECC value generated for the last of the subsequent operations of the test.

14. The apparatus of claim 13, wherein the processing device is to invalidate the test responsive to the ECC value in the event log and the ECC value generated for the last of the subsequent operations of the test being different values.

15. The apparatus of claim 10, wherein validating the test comprises validating that the initial operation and subsequent operations of the test were performed on correct addresses in the memory component.

16. The apparatus of claim 10, wherein validating the test comprises validating that the initial operation and subsequent operations of the test were performed in a correct sequence.

* * * * *